US008902662B2

(12) United States Patent
Shiga et al.

(10) Patent No.: US 8,902,662 B2
(45) Date of Patent: Dec. 2, 2014

(54) MEMORY SYSTEM HAVING NONVOLATILE SEMICONDUCTOR MEMORIES WITH CONTROL OPERATION HAVING HIGH-CURRENT AND LOW-CURRENT PERIODS

(75) Inventors: Hitoshi Shiga, Yokohama (JP); Masahiro Yoshihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 485 days.

(21) Appl. No.: 13/226,180

(22) Filed: Sep. 6, 2011

(65) Prior Publication Data

US 2012/0063234 A1    Mar. 15, 2012

(30) Foreign Application Priority Data

Sep. 6, 2010  (JP) .................................. 2010-199381

(51) Int. Cl.
*G11C 11/34*    (2006.01)
*G11C 16/04*    (2006.01)
*G11C 16/30*    (2006.01)
*G11C 16/10*    (2006.01)

(52) U.S. Cl.
CPC ................ *G11C 16/10* (2013.01); *G11C 16/30* (2013.01)
USPC ..................................................... 365/185.18

(58) Field of Classification Search
None
See application file for complete search history.

(56) References Cited

U.S. PATENT DOCUMENTS

| 7,224,617 | B2 | 5/2007 | Takeuchi |
| 7,269,073 | B2 | 9/2007 | Takeuchi |
| 7,486,569 | B2 * | 2/2009 | Fujita et al. ............... 365/189.04 |
| 7,518,922 | B2 | 4/2009 | Maejima et al. |
| 7,643,347 | B2 | 1/2010 | Abiko et al. |
| 8,130,550 | B1 * | 3/2012 | Confalonieri ............ 365/185.11 |
| 2005/0041478 | A1 * | 2/2005 | Matsushita et al. ....... 365/185.29 |

FOREIGN PATENT DOCUMENTS

| JP | 11-242632 | 9/1999 |
| JP | 2008-197807 | 8/2008 |

OTHER PUBLICATIONS

U.S. Appl. No. 13/426,977, filed Mar. 22, 2012, Shimizu.
Office Action mailed Feb. 25, 2014, in Japanese Patent Application No. 2010-199381, filed Sep. 6, 2010 (with English-language translation).

* cited by examiner

*Primary Examiner* — Kretelia Graham
(74) *Attorney, Agent, or Firm* — Oblon, Spivak, McClelland, Maier & Neustadt, L.L.P.

(57) ABSTRACT

According to one embodiment, a memory system includes a first nonvolatile semiconductor memory, a second nonvolatile semiconductor memory and a controller. The first memory has memory cells and executes a first operation that is at least one of write, read, and erase operations with respect to the memory cells. The first operation includes a first sub-operation and a second-sub operation that consume a current which is equal to or higher than a predetermined current. The second memory has memory cells and executes a second operation that is at least one of write, read, and erase operations with respect to the memory cells. The second operation includes a third sub-operation and a fourth sub-operation that consume a current which is equal to or higher than the predetermined current. The controller controls the first operation and the second operation of the first memory and the second memory.

12 Claims, 13 Drawing Sheets

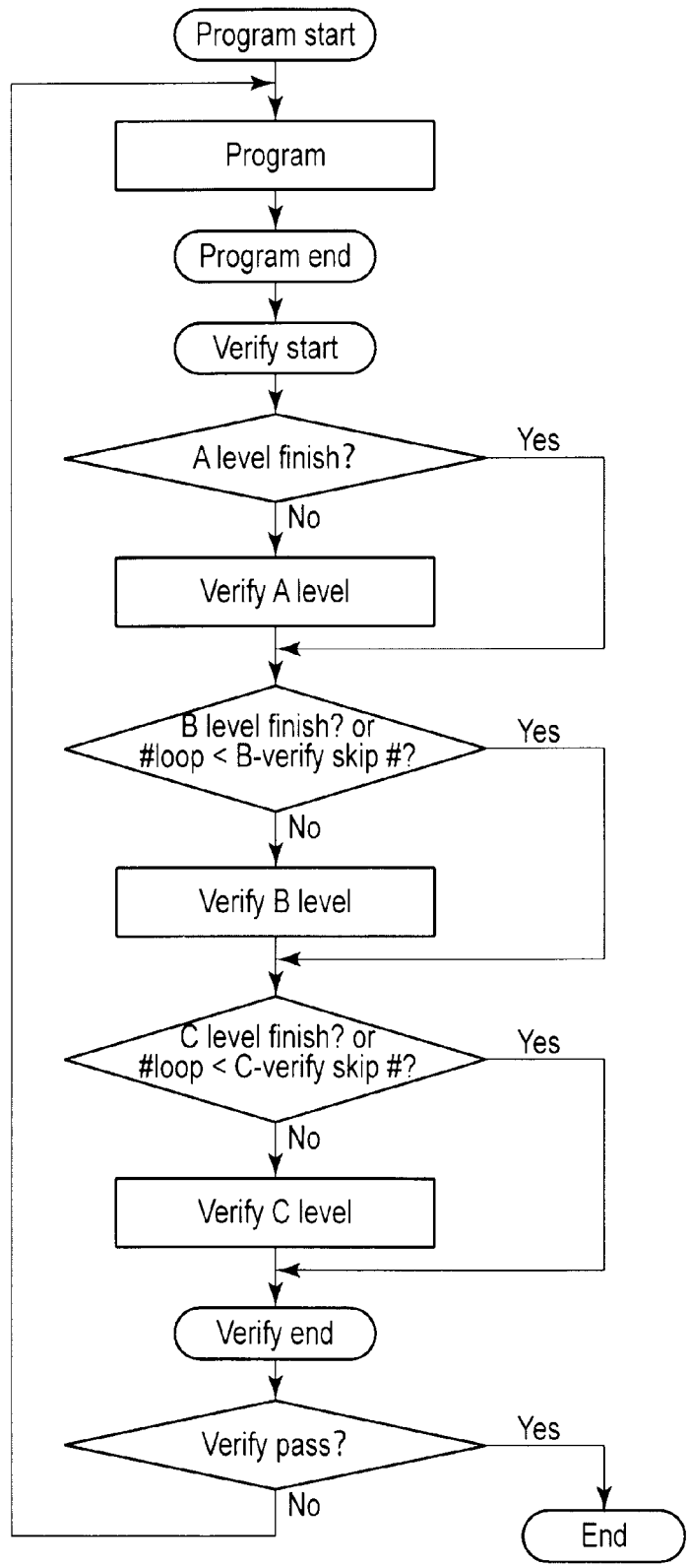
F I G. 2

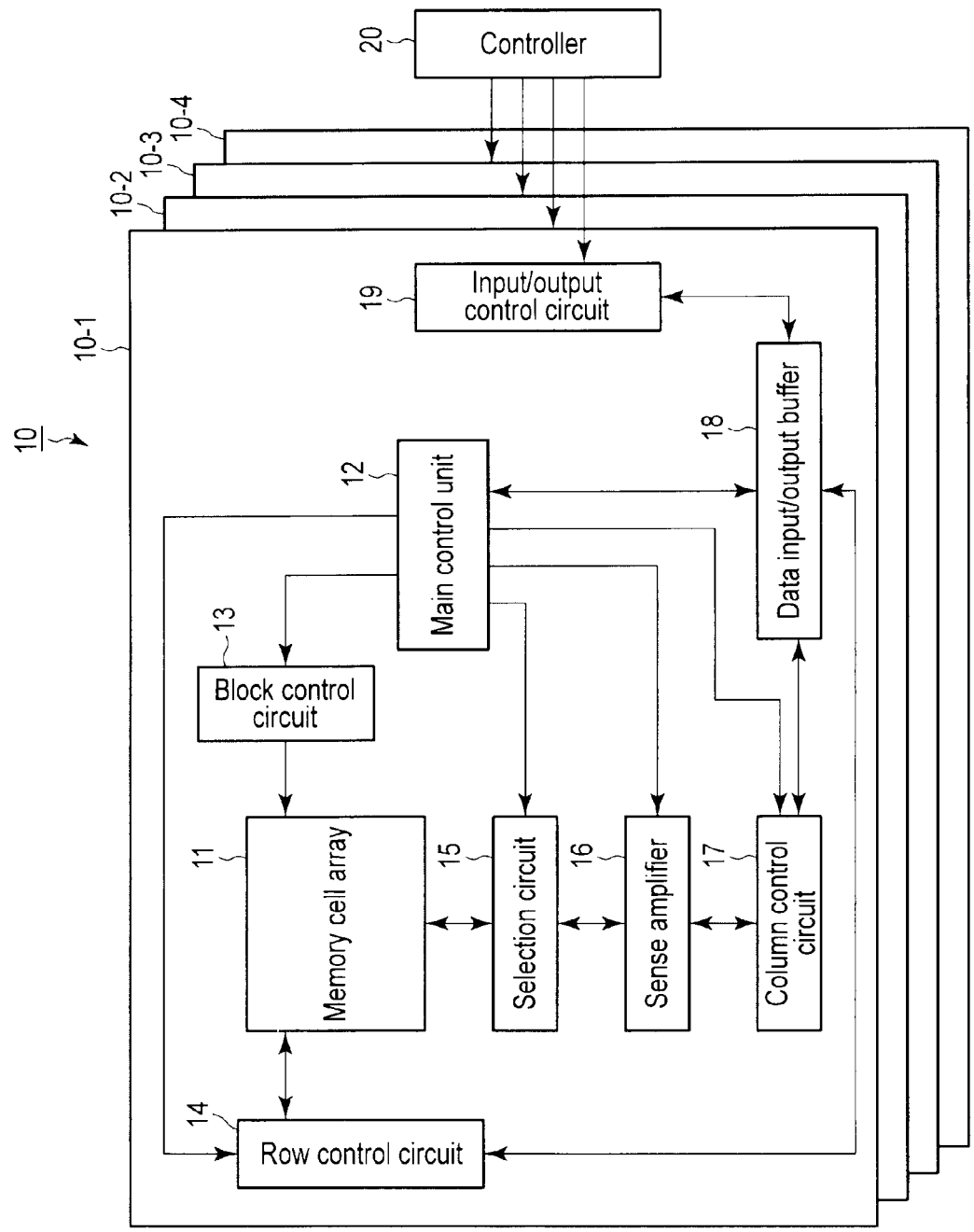
F I G. 3

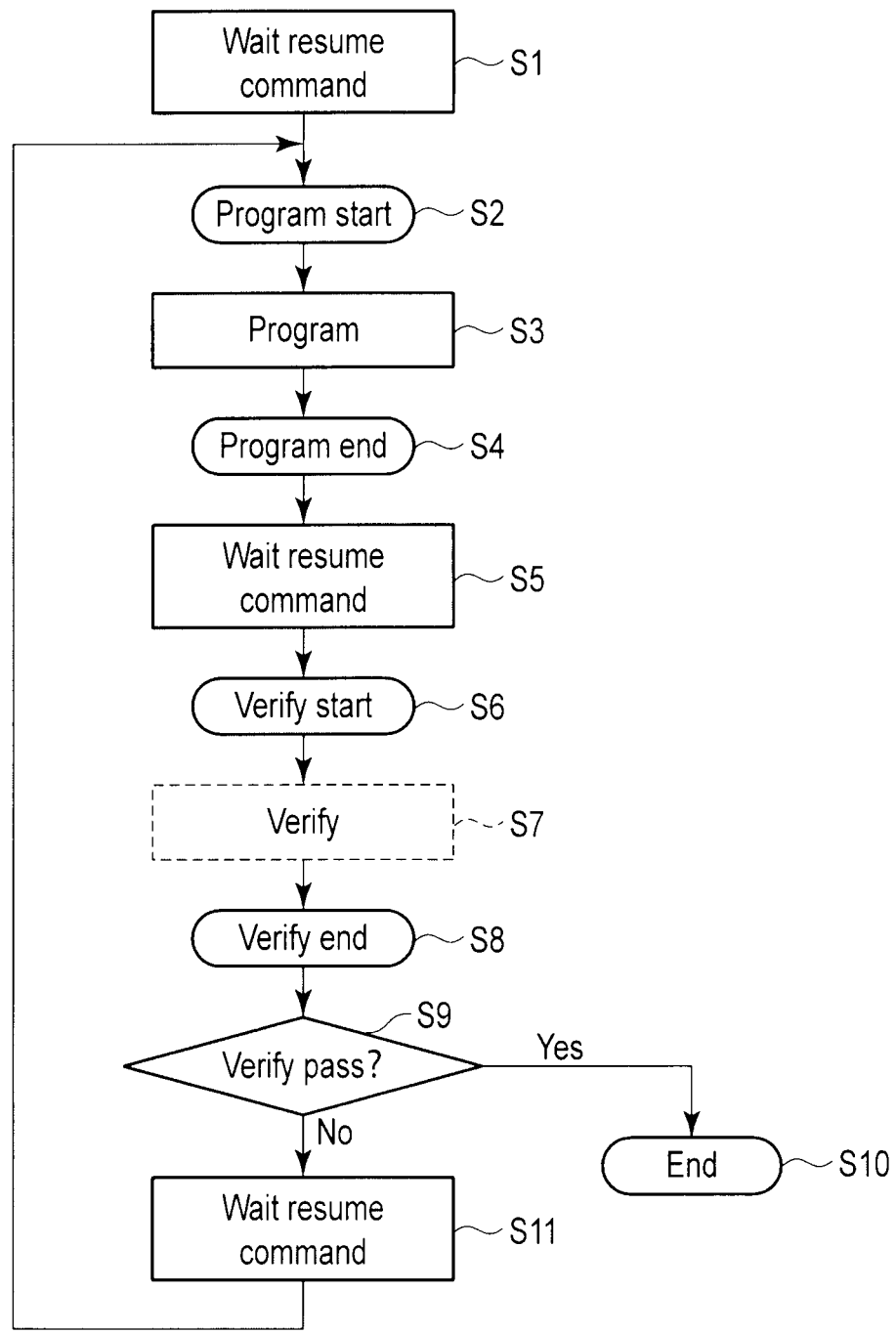
F I G. 4

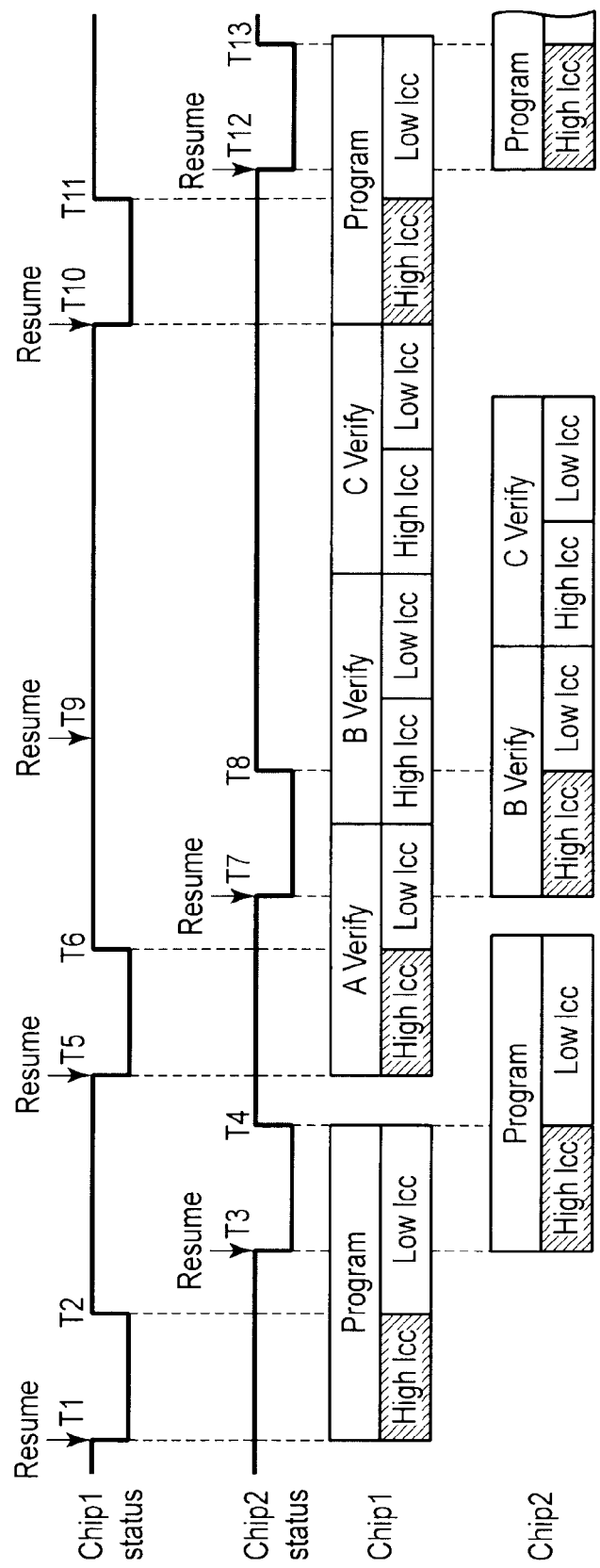
F I G. 6

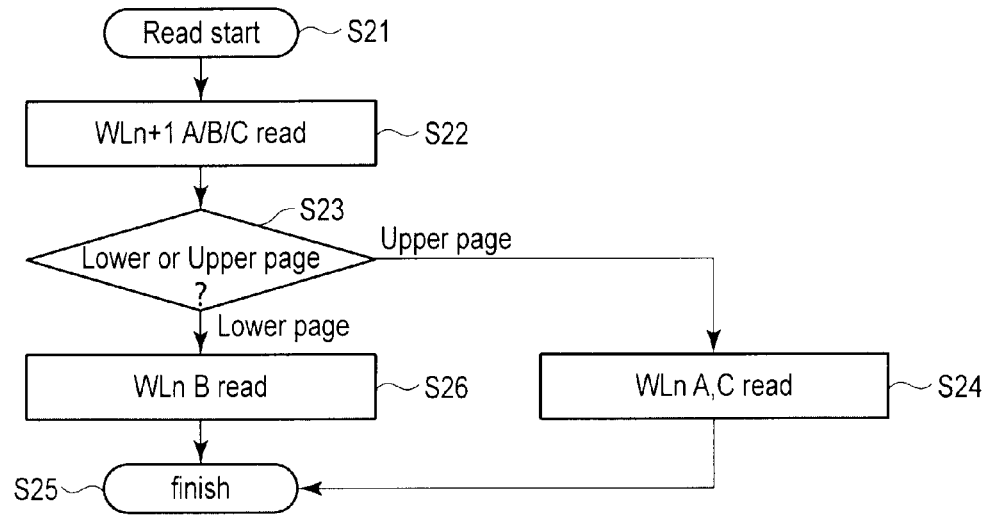
F I G. 9
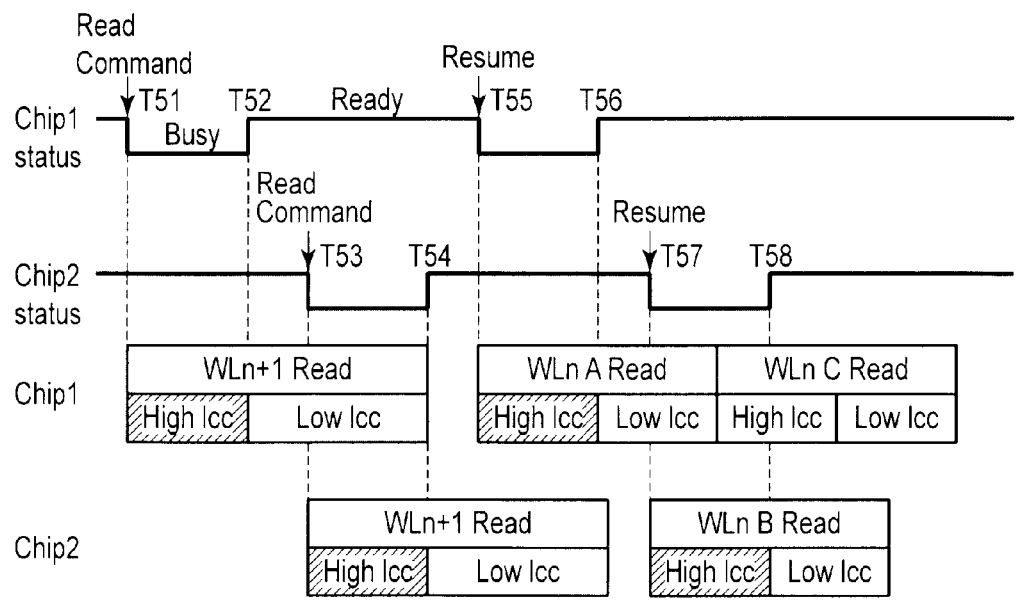
F I G. 10

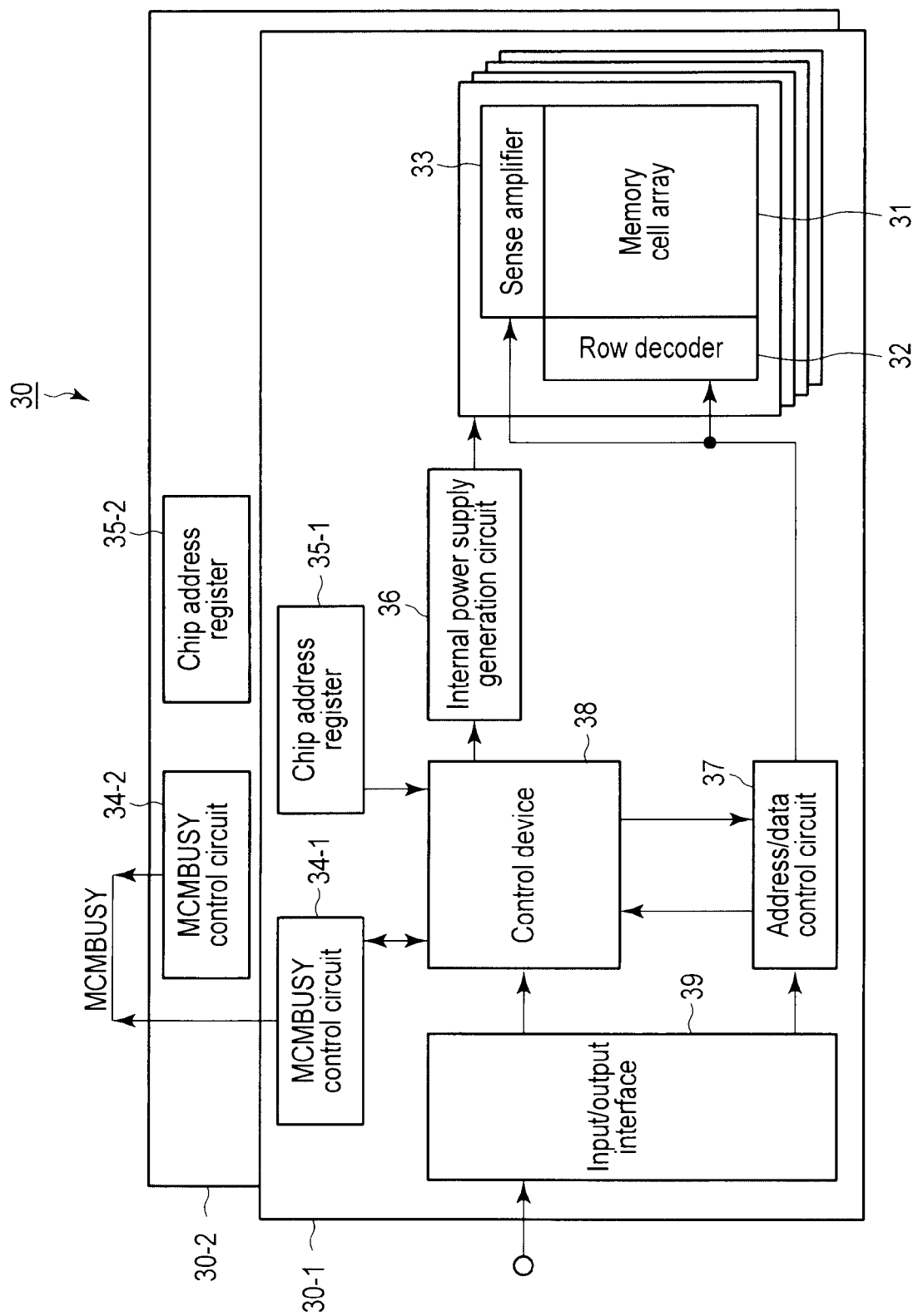
F I G. 11

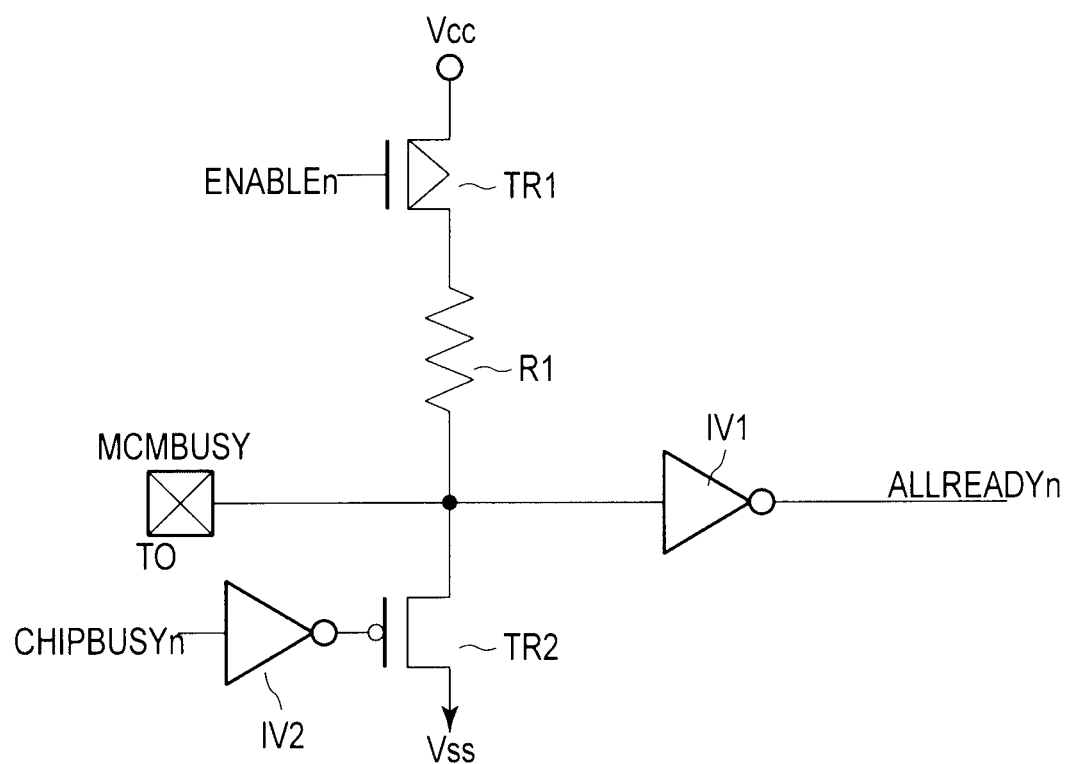
F I G. 12

US 8,902,662 B2

MEMORY SYSTEM HAVING NONVOLATILE SEMICONDUCTOR MEMORIES WITH CONTROL OPERATION HAVING HIGH-CURRENT AND LOW-CURRENT PERIODS

CROSS-REFERENCE TO RELATED APPLICATIONS

This application is based upon and claims the benefit of priority from prior Japanese Patent Application No. 2010-199381, filed Sep. 6, 2010, the entire contents of which are incorporated herein by reference.

FIELD

Embodiments described herein relate generally to a memory system having nonvolatile semiconductor memories.

BACKGROUND

In recent years, with advancement of miniaturization, a write speed of a NAND type flash memory is reduced. On the other hand, since an amount of data processed by a memory system having NAND type flash memories tends to increase, improvement in the write performance of the memory system is attempted by executing a write operation with respect to the NAND type flash memories at the same time.

In this case, however, since the NAND type flash memories are operated at the same time, an operation current is increased. In particular, there is a concern that peaks of the operation currents in the NAND type flash memories overlap and a large peak current flows.

BRIEF DESCRIPTION OF THE DRAWINGS

FIG. 2 is a flowchart of the program operation and the program verify operation in a multilevel NAND type flash memory;

FIG. 3 is a block diagram showing a configuration of a memory system according to a first embodiment;

FIG. 4 is a flowchart of a write operation in the NAND type flash memory according to the first embodiment;

FIG. 6 is a first example showing the timing chart of the write operation in the NAND type flash memory according to the first embodiment;

FIG. 9 is a flowchart showing a read operation in the NAND type flash memory according to the first embodiment;

FIG. 10 is a timing chart of the read operation in the NAND type flash memory according to the first embodiment;

FIG. 11 is a block diagram showing a configuration of a memory system according to a second embodiment;

FIG. 12 is a circuit diagram showing a configuration of an MCMBUSY control circuit in a NAND type flash memory according to the second embodiment;

DETAILED DESCRIPTION

Figure 1:
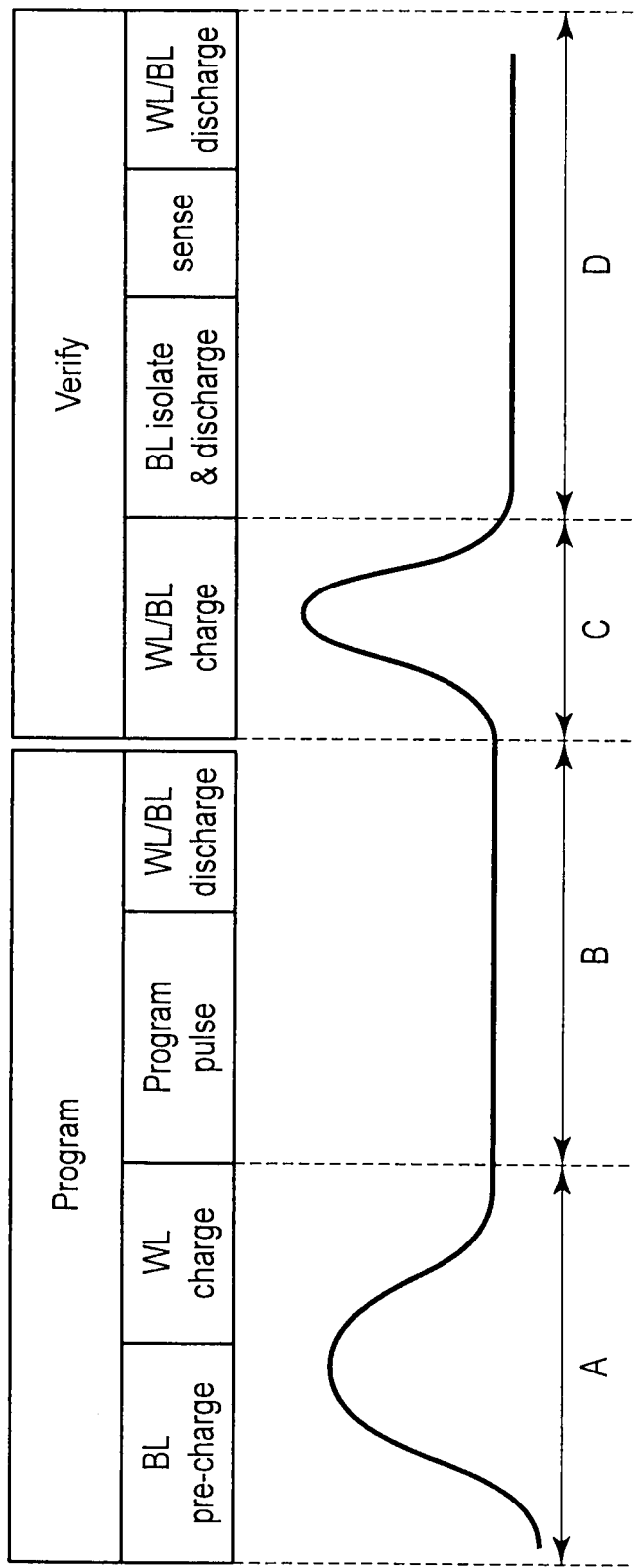
FIG. 1 is a view schematically showing timings and operation currents at the time of a program operation and a program verify operation.

In general, according to one embodiment, a memory system includes a first nonvolatile semiconductor memory, a second nonvolatile semiconductor memory and a controller. The first nonvolatile semiconductor memory has memory cells and executes a first operation that is at least one of write, read, and erase operations with respect to the memory cells. The first operation includes a first sub-operation and a second-sub operation that consume a current which is equal to or higher than a predetermined current. The second nonvolatile semiconductor memory has memory cells and executes a second operation that is at least one of write, read, and erase operations with respect to the memory cells. The second operation includes a third sub-operation and a fourth sub-operation that consume a current which is equal to or higher than the predetermined current. The controller controls the first operation and the second operation of the first nonvolatile semiconductor memory and the second nonvolatile semiconductor memory. The first nonvolatile semiconductor memory executes the first sub-operation included in the first operation and then interrupts the first operation when the first nonvolatile semiconductor memory receives a first control signal from the controller. The controller transmits a second control signal to the second nonvolatile semiconductor memory when the controller recognizes that the first operation is interrupted. The second nonvolatile semiconductor memory executes the third sub-operation included in the second operation and then interrupts the second operation when the second nonvolatile semiconductor memory receives the second control signal from the controller. The controller transmits a third control signal to the first nonvolatile semiconductor memory when the controller recognizes that the second operation is interrupted. The first nonvolatile semiconductor memory restarts the first operation to execute the second sub-operation when the first nonvolatile semiconductor memory receives the third control signal from the controller. The controller transmits a fourth control signal to the second nonvolatile semiconductor memory when the controller recognizes that the second sub-operation is executed. The second nonvolatile semiconductor memory restarts the second operation to execute the fourth sub-operation when the second nonvolatile semiconductor memory receives the fourth control signal from the controller.

The background to this application will be first explained before describing the embodiment.

When operating nonvolatile semiconductor memory chips at the same time, an operation current may possibly increase. For example, when a write operation is executed with respect to NAND type flash memory chips (which will be referred to as memory chips hereinafter) at the same time, there is a concern that peak currents consumed by the respective memory chips overlap and a large peak of consumption power occurs. It is to be noted that the write operation includes a program operation and a program verify operation in the following description.

FIG. 1 schematically shows timings in a program operation (which will be referred to as "program" in the drawing, and this is also the same in the following description) and a program verify operation ("Verify") and operation currents at these timings. Both the program operation and the program verify operation are roughly divided into individual operations, i.e., setup of word lines/bit lines (A, C)→a write or read sense operation→discharge of a word line/bit line potential (a recovery operation) (B, D). It is to be noted that, in FIG. 1, A means "BL pre-charge" bit line pre-charge and "WL" word line charge, B means a "program pulse" program pulse and "WL/BL discharge" word line/bit line discharge, C means a "WL/BL charge" word line/bit line charge, and D means "BL isolate & discharge" discharge using a cell current in a bit line, "sense" a read sense operation and "WL/BL discharge" word/bi line discharge.

A necessary time for each operation is determined by a timer in the memory chip in advance. An operation current of the memory chip is not fixed, and a large peak current is generated by a specific operation.

When the write operation is executed in the memory chips at the same time, preventing the peak currents from overlapping in the memory chips is critical. For example, a method of staggering timings for executing the write operation can be considered, but it is actually difficult to avoid the overlap by this method alone. An example of the avoidance will now be described.

FIG. 2 shows a flow of the program operation ("program") and the program verify operation ("Verify") in the multilevel NAND type flash memory.

In the multilevel NAND type flash memory, although the verify operation is carried out in accordance with each threshold voltage level, when the program operation is terminated in accordance with each level, the verify operation for the corresponding levels do not have to be executed. Here, the verify operation for three levels (A<B<C) is carried out.

Further, in general, since writing data into each memory cell in the NAND type flash memory starts from a low threshold voltage level, refusing the verify operation for the levels B and C for a given number of times is carried out immediately after start of the write operation in order to improve write performance. FIG. 2 shows an example in which writing data into each memory cell starts from a low threshold voltage level in order of A→B→C, but writing data into each memory cell may be carried out in order of C→A→B.

That is, a timing at which a peak current flows differs depending on each memory chip, and this timing results from cell characteristics of each memory cell. Therefore, controlling the timing at which the peak current flows is difficult.

As another factor, the NAND type flash memory generates a clock in a cycle of, e.g., 100 nm by using an oscillator provided in a memory chip in response to a command input thereto. A control circuit (a state machine) operates in synchronization with this clock.

When a timer setting is the same in memory chips, this clock cycle varies. Since a write or read time of the NAND type flash memory is tens of μs to a few ms, a variation in the clock cycle cannot be ignored, and peak currents may possibly overlap in some memory chips.

When a write sequence is executed in the NAND type flash memories at the same time, there is a concern that peak currents generated in the respective NAND flash memories overlap and an operation current that is very large for the memory system occurs. Therefore, a power supply system that can cope with this maximum peak current must be incorporated in the memory system.

Thus, in this embodiment, there is provided a memory system that can suppress a peak of consumption power generated in a memory system having nonvolatile semiconductor memories.

The embodiment will now be described hereinafter with reference to the drawing. It is to be noted that like reference numerals denote elements having the same functions and configuration, and an overlapping explanation will be given only when needed.

[1] First Embodiment

A memory system according to the first embodiment will now be described.

FIG. 3 is a block diagram showing a configuration of a memory system according to the first embodiment.

As shown in the drawing, a memory system 10 comprises nonvolatile semiconductor memory chips, e.g., NAND type flash memory chips (which will be referred to as memory chips hereinafter) 10-1, 10-2, 10-3, and 10-4 and a controller 20. The controller 20 controls operations of the memory chips 10-1, 10-2, 10-3, and 10-4.

Each memory chip comprises a memory cell array 11, a main control unit 12, a block control circuit 13, a row control circuit 14, a selection circuit 15, a sense amplifier 16, a column control circuit 17, a data input/output buffer 18, and an input/output control circuit 19.

The main control unit 12 receives a control signal output from the controller 20 through the input/output control circuit 19 and the data input/output buffer 18 and controls the block control circuit 13, the row control circuit 14, the selection circuit 15, the sense amplifier 16, and the column control circuit 17 to perform write, read, and erase data with respect to the memory cell array 11.

The block control circuit 13 controls selection of a block included in the memory cell array 11. The row control circuit 14 controls a voltage applied to each words line in the memory cell array 11 when writing, reading, and erasing data with respect to the memory cell array 11.

The column control circuit 17 controls selection of a bit line in the memory cell array 11 based on a column address. The sense amplifier 16 reads out data from a memory cell connected to a selected bit line through the selection circuit 15.

The memory cell array 11 comprises blocks, and each block has NAND strings. Each NAND string has memory cells connected in series, and each memory cell is constituted of a nonvolatile memory cell transistor having a floating gate and a control gate arranged above the floating gate through an inter-gate insulating film.

Operations at the time of a write operation in the memory system according to the first embodiment will now be described. Here, although the write operation in the two NAND type flash memory chips 10-1 and 10-2 will be explained, the write operation can be likewise executed with respect to three or more memory chips by the same technique.

Figure 5:
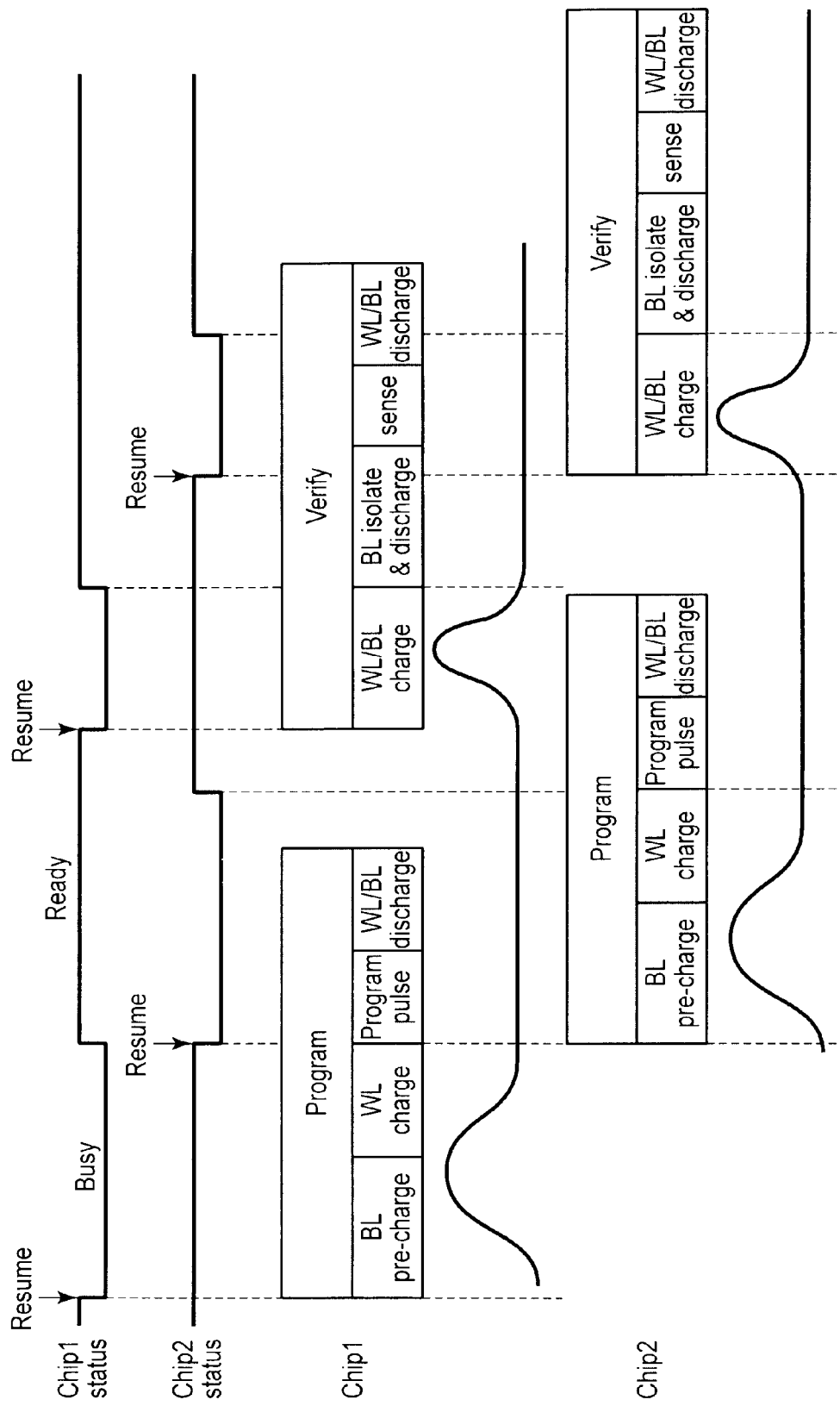
FIG. 5 is a timing chart of the write operation in the NAND type flash memory according to the first embodiment.

FIG. 4 is a flowchart at the time of the write operation in the NAND type flash memory chips 10-1 and 10-2 according to the first embodiment. FIG. 5 is a timing chart at the time of the write operation in the first embodiment.

First, the main control unit 12 in each of the memory chips 10-1 and 10-2 waits unit a resume command is input from the controller 20 (("Wait Resume Command") a step S1). When the main control unit 12 receives the resume command from the controller 20, it starts a program operation (("Program start") a step S2) and executes the program operation (("Program") a step S3). As shown in FIG. 5, the program operation is executed in the order of pre-charge of a bit line, charge of a word line, application of a program pulse, and discharge of a word line/bit line potential.

When the program operation is terminated (("program end") a step S4), the main control unit 12 sets the memory chip in a suspend state (a pause state) and again waits until the resume command is input from the controller 20 (("Wait Resume Command") a step S5).

Then, upon receiving the resume command, the main control unit 12 starts a program verify operation (("Verify start") a step S6) and executes the program verify operation (("Verify") a step S7). As shown in FIG. 5, the program verify operation is executed in the order of charge of a word line/bit line, discharge of a bit line using a cell current, a read/sense operation, and discharge of a word line/bit line potential.

When the program verify operation is terminated (("Verify end") a step S8), the main control unit 12 judges whether the memory cell has passed the verify operation (("Verify Pass") a step S9). When the verify operation has been passed, the write operation is terminated (("End") a step S10).

On the other hand, when the verify operation has not been passed, the main control unit 12 sets the memory chip in the suspend state and again waits until the resume command is input from the controller 20 (("Wait Resume Command") a step S11). Furthermore, when the main control unit 12 receives the resume command from the controller 20, it returns to the step S2 to repeat the processing of the step S2 and subsequent steps.

Operations in the write operation will now be described with reference to FIG. 5. It is to be noted that, in FIG. 5 and subsequent figures, the NAND type flash memory chip 10-1 is a chip 1 and the NAND type flash memory chip 10-2 is a chip 2. In regard to chip statuses, "H" means a ready state, and "L" means a busy state. In respect to an output in this ready state or busy state, an output pin may be provided to the memory chip, or a status command may be output from the memory chip.

First, when the chip 1 is in the ready state, the controller 20 outputs the resume command ("Resume") to the chip 1. Upon receiving the resume command, the chip 1 starts the program operation ("program"). Moreover, the chip 1 carries out precharge of a bit line ("BL pre-charge") and then performs charge of a word line ("WL charge"). When the charge of the word line is terminated, i.e., when a period requiring a high current is terminated, the chip 1 notifies the controller 20 that the chip 1 is in the ready state.

After the end of the charge of the word line, the chip 1 executes application of a program pulse ("program pulse") and discharge of a word line/bit line potential ("WL/BL discharge") and terminates the program operation. After the end of the program operation, the chip 1 enters the suspend state. In the program operation, a period in which the pre-charge of the bit line and the charge of the word line are carried out is a period requiring a high current (a high-current period), and a period in which the application of the program pulse and the discharge of the word line/bit line potential are performed is a period requiring a low current (a low-current period).

When the controller 20 recognizes that the chip 1 is in the ready state, the controller 20 outputs the resume command to the chip 2. When the chip 2 receives the resume command, it starts the program operation. Additionally, the chip 2 executes the pre-charge of a bit line and the charge of a word line. At this time, as described above, the operations in the low-current period, i.e., the application of the program pulse and the discharge of the word line/bit line are executed in the chip 1 simultaneously with these operations in the high-current period of the chip 2. Upon end of the charge of the word line, i.e., end of the high-current period, the chip 2 notifies the controller 20 that the chip 2 is in the ready state.

After the end of the charge of the word line, the chip 2 performs the application of the program pulse and the discharge of the word line/bit line potential and terminates the program operation. After terminating the program operation, the chip 2 enters the suspend state.

When the controller 20 recognizes that the chip 2 is in the ready state, it outputs the resume command to the chip 1. Upon receiving the resume command, the chip 1 starts the program verify operation ("Verify"). Further, the chip 1 performs the charge of the word line/bit line ("WL/BL charge"). At this time, as described above, the operations in the low-current period, i.e., the application of the program pulse and the discharge of the word line/bit line are performed in the chip 2 simultaneously with these operations in the high-current period of the chip 1. When the charge of the word line/bit line in the chip 1 is terminated, i.e., when the period requiring a high current is finished, the chip 1 notifies the controller 20 that the chip 1 is in the ready state.

After the end of the charge of the word line/bit line, the chip 1 executes discharge of a bit line using a cell current ("BL isolate & discharge"), a read/sense operation ("sense"), and discharge of a word line/bit line potential ("WL/BL discharge") to terminate the program verify operation. After the end of the program verify operation, the chip 1 enters the suspend state. In the program verify operation, a period in which the charge of the word line/bit line is performed is the period requiring a high current (the high-current period), and a period in which the discharge of the bit line using the cell current, the read/sense operation, and the discharge of the word line/bit line potential are carried out is the period requiring a low current (the low-current period).

When the controller 20 recognizes that the chip 1 is in the ready state, it outputs the resume command to the chip 2. When the chip 2 receives the resume command, it starts the program verify operation. Furthermore, the chip 2 performs the charge of the word line/bit line. At this time, the operations in the low-current period, i.e., the discharge of the bit line using the cell current, the read/sense operation, and the discharge of the word line/bit line potential are carried out simultaneously with these operations in the high-current period of the chip 2. When the charge of the word line/bit line in the chip 2 is finished, the chip 2 notifies the controller 20 that the chip 2 is in the ready state.

After the end of the charge of the word line/bit line, the chip 2 carries out the discharge of the bit line using the cell current, the read/sense operation, and the discharge of the word line/bit line potential to terminate the program verify operation. After the end of the program verify operation, the chip 2 enters the suspend state.

As described above, the NAND type flash memory chip enters the busy state during the operation producing a peak current and outputs a signal indicative of the busy state to the controller 20. Furthermore, the NAND type flash memory chip changes to the suspend state to wait for input of the resume command before the next operation that generates a peak current.

The controller 20 grasps the operation that produces the peak current as Ready/Busy in accordance with each memory chip and issues the resume command so that the busy state does not overlap in the memory chips, thereby preventing the operations that generate the peak current from overlapping in the memory chips. That is, the controller 20 can stagger the peak currents generated in the respective memory chips by controlling a timing for issuing the resume command. As a result, it is possible to reduce a peak of a consumption power generated in the memory system having the memory chips.

The operations in the write operation in the memory system according to the first embodiment will now be described in detail with three examples.

FIG. 6 shows a first example of a timing charge at the time of the write operation in the NAND type flash memory chips 10-1 and 10-2 according to the first embodiment.

In this first example, operations in the program operation and the program verify operation are separated from each other so that the program operation and the program verify operation start the operations, respectively, in response to input of the resume command. It is to be noted that the high-current period in which the peak current flows is represented as "High Icc" and the low-current period in which the peak current does not flow is represented as "Low Icc".

In the chips 1 and 2, the high-current period of the program operation and the high-current period of the program verify operation are prevented from overlapping each other. In the program verify operation, the verify operation is performed in accordance with each threshold voltage level, and it is assumed that the verify operation is executed for three levels (A<B<C) in this example. It is to be noted that the high-current period of the program verify operation in the chip 1 is a high-current period of an A verify operation at the top alone. Moreover, in the chip 2, it is assumed that the A verify operation has already been passed and a high-current period of the program verify operation in the chip 2 is a high-current period of a B verify operation at the top alone.

The operations at the time of the write operation shown in FIG. 6 will now be described in detail.

First, when the chip 1 is in the ready state, the controller 20 outputs the resume command ("Resume") to the chip 1 (T1). When the chip 1 receives the resume command, it starts the program operation ("Program"). Additionally, the chip 1 carries out the operation in the high-current period (High Icc) that the peak current flows. When the high-current period is terminated, i.e., when the operation that consumes a high current is terminated, the chip 1 notifies the controller 20 that the chip 1 is in the ready state (T2).

After the end of the high-current period, the chip 1 performs the operation in the low-current period (Low Icc) that the peak current does not flow and terminates the program operation. After the end of the program operation, the chip 1 enters the suspend state. As described above, in the program operation, a period in which the pre-charge of the bit line and the charge of the word line are performed is a high-current period and a period in which the application of the program pulse and the discharge of the word line/bit line potential are executed is the low-current period.

When the controller 20 recognizes that the chip 1 is in the ready state, it outputs the resume command to the chip 2 (T3). When the chip 2 receives the resume command, it starts the program operation. Further, the chip 2 executes the operation in the high-current period. At this time, the operation in the low-current period is performed in the chip 1 simultaneously with the operation in the high-current period of the chip 2. When the high-current period of the chip 2 is terminated, the chip 2 notifies the controller 20 that the chip 2 is in the ready state (T4).

After the end of the high-current period of the chip 2, the chip 2 performs the operation in the low-current period and terminates the program operation. After the end of the program operation, the chip 2 enters the suspend state.

When the controller 20 recognizes that the chip 2 is in the ready state, the controller 20 outputs the resume command to the chip 1 (T5). When the chip 1 receives the resume command, it starts the program verify operation. Moreover, the chip 1 executes the operation in the high-current period of the A verify operation ("A Verify"). When the high-current period is terminated, the chip 1 notifies the controller 20 that the chip 1 is in the ready state (T6).

After the end of the high-current period, the chip 1 carries out the operation in the low-current period. That is, the chip 1 executes the operation in the low-current period of the A verify operation, the B verify operation ("B Verify"), and the C verify operation ("C Verify"). Further, the chip 1 terminates the program verify operation. As described above, in the program verify operation, the period in which the charge of the word line/bit line is performed is the high-current period requiring a high current, and the period in which the discharge of the bit line using the cell current, the read/sense operation, and the discharge of the word line/bit line potential are carried out is the low-current period requiring a low current.

When the controller 20 recognizes that the chip 1 is in the ready state, it outputs the resume command to the chip 2 (T7). When the chip 2 receives the resume command, it starts the program verify operation. Furthermore, the chip 2 performs the operation in the high-current period of the B verify operation. At this time, the operation in the low-current period is performed in the chip 1 simultaneously with this operation in the high-current period of the chip 2. When the high-current period of the chip 2 is terminated, the chip 2 notifies the controller 20 that the chip 2 is in the ready state (T8).

After the high-current period is finished, the chip 2 performs the operation in the low-current period. That is, the chip 2 carries out the operation in the low current period of the B verify operation and also executes the C verify operation. Moreover, the chip 2 terminates the program verify operation. After terminating the program verify operation, the chip 2 enters the suspend state.

When the controller 20 recognizes that the chip 2 is in the ready state, it outputs the resume command to the chip 1 (T9). The chip 1 receives the resume command, and starts the next program operation when the C verify operation is terminated (T10). Additionally, the chip 1 performs the operation in the high-current period. When the high-current period is finished, the chip 1 notifies the controller 20 that the chip 1 is in the ready state (T11).

After the end of the high-current period, the chip 1 carries out the operation in the low-current period and terminates the program operation. After the end of the program operation, the chip 1 enters the suspend state.

When the controller 20 recognizes that the chip 1 is in the ready state, the controller 20 outputs the resume command to the chip 2 (T12). When the chip 2 receives the resume command, it starts the program operation. Additionally, the chip 2 carries out the operation in the high-current period. When the high-current period is terminated, the chip 2 notifies the controller 20 that the chip 2 is in the ready state (T13).

After the end of the high-current period, the chip 2 carries out the operation in the low-current period and terminates the program operation. After the end of the program operation, the chip 2 enters the suspend state.

The above-described operations are repeated.

Figure 7:
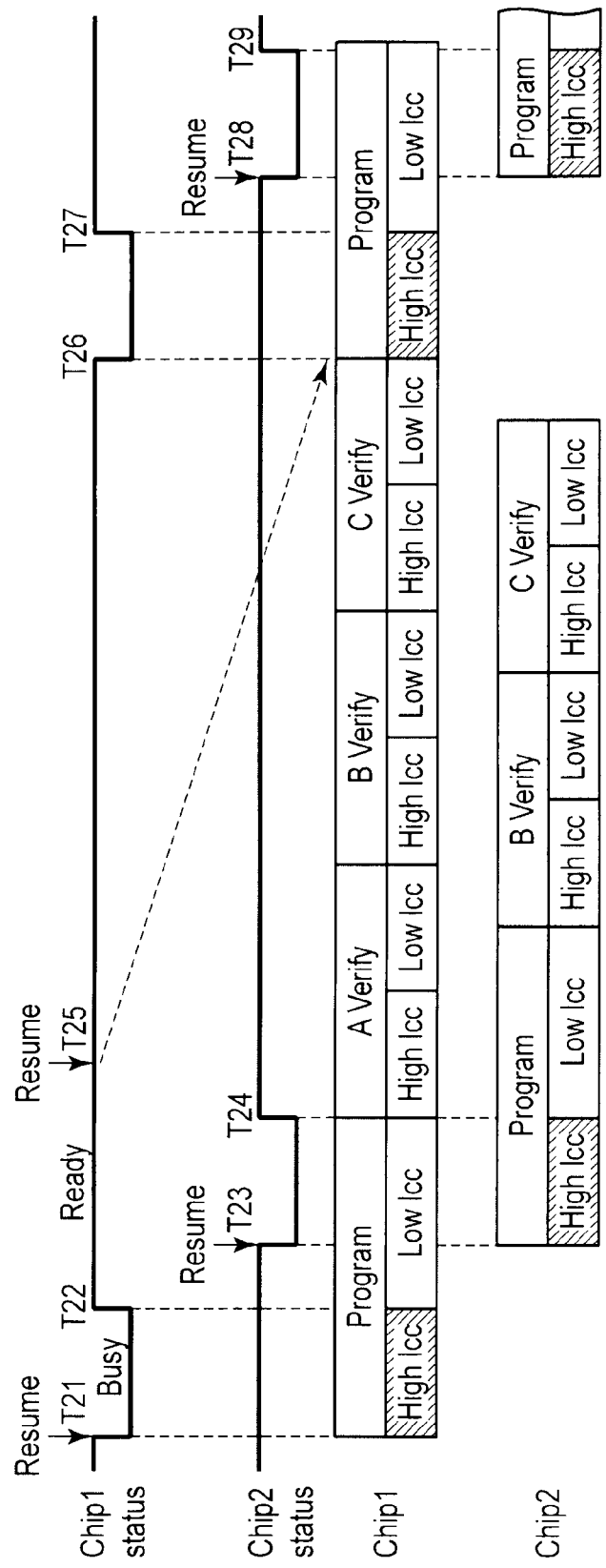
FIG. 7 is a second example showing the timing chart of the write operation in the NAND type flash memory according to the first embodiment.

FIG. 7 shows a second example of a timing chart at the time of the write operation in the NAND type flash memory chips 10-1 and 10-2 according to the first embodiment.

In the first example, the operations in the program operation are separated from the operations in the program verify operation, and the operations in the program operation and the program verify operation are started by input of the resume command, respectively. In this second example, the program operation and the program verify operation are configured as one continuously effected sequence, and the operations in the program operation and in the program verify operation are continuously executed in response to input of the resume command.

The high-current period (High Icc) of the program operation alone is prevented from overlapping in the chips 1 and 2. That is, a first operation in which a peak current flows in the program operation is prevented from overlapping in the chip 1 and the chip 2. In the program verify operation, the verify operation is carried out in accordance with each threshold voltage level, and it is assumed that the verify operation is executed with respect to three levels (A<B<C) in this example. It is to be noted that the high-current period (High Icc) of the program verify operation in each of the chips 1 and 2 has a smaller amount of peak current than that in the high-current period (High Icc) of the program operation. Therefore, the high-current period of the program verify operation does not have to be completely staggered. Further, in the chip 2, it is assumed that the A verify operation has already been passed.

The operation at the time of the write operation shown in FIG. 7 will now be described hereinafter in detail.

First, when the chip 1 is in the ready state, the controller 20 outputs the resume command ("Resume") to the chip 1 (T21). When the chip 1 receives the resume command, it starts the program operation ("Program"). Furthermore, the chip 1 performs the operation in the high-current period (High Icc) during which a peak current flows. When the high-current period is ended, i.e., when the operation that consumes a high current is terminated, the chip 1 notifies the controller 20 that the chip 1 is in the ready state (T22).

After the end of the high-current period, the chip 1 performs the operation in the low-current period (Low Icc) during which a peak current does not flow and terminates the program operation. Further, after the end of the program operation, the chip 1 starts the program verify operation. Furthermore, the chip 1 carries out the A verify operation ("A Verify"), the B verify operation ("B Verify"), and the C verify operation ("C Verify").

When the controller 20 recognizes that the chip 1 is in the ready state, it outputs the resume command to the chip 2 (T23). When the chip 2 receives the resume command, it starts the program operation. Moreover, the chip 2 executes the operation in the high-current period. At this moment, as described above, the operation in the low-current period is performed in the chip 1 simultaneously with the operation in the high-current period of the chip 2. When the high-current period of the chip 2 is terminated, the chip 2 notifies the controller 20 that the chip 2 is in the ready state (T24).

After the end of the high-current period, the chip 2 performs the operation in the low-current period and terminates the program operation. Additionally, after terminating the program operation, the chip 2 starts the program verify operation. Further, the chip 1 carries out the B verify operation and the C verify operation. After terminating the program verify operation, the chip 2 enters the suspend state.

When the controller 20 recognizes that the chip 2 is in the ready state, it outputs the resume command to the chip 1 (T25). When the chip 1 receives the resume command and the C verify operation is terminated, the chip 1 starts the next program operation (T26). Additionally, the chip 1 carries out the operation in the high-current period. When the high-current period is terminated, the chip 1 notifies the controller 20 that the chip 1 is in the ready state (T27).

After the end of the high-current period, the chip 1 performs the operation in the low-current period and terminates the program operation. Further, after terminating the program operation, the chip 1 starts the program verify operation.

When the controller 20 recognizes that the chip 1 is in the ready state, it outputs the resume command to the chip 2 (T28). When the chip 2 receives the resume command, it starts the program operation. Furthermore, the chip 2 executes the operation in the high-current period. When the high-current period is finished, the chip 2 notifies the controller 2 that the chip 2 is in the ready state (T29).

After the end of the high-current period, the chip 2 executes the operation in the low-current period and terminates the program operation. Moreover, after terminating the program operation, the chip 2 starts the program verify operation.

The above-described operations are repeated.

Figure 8:
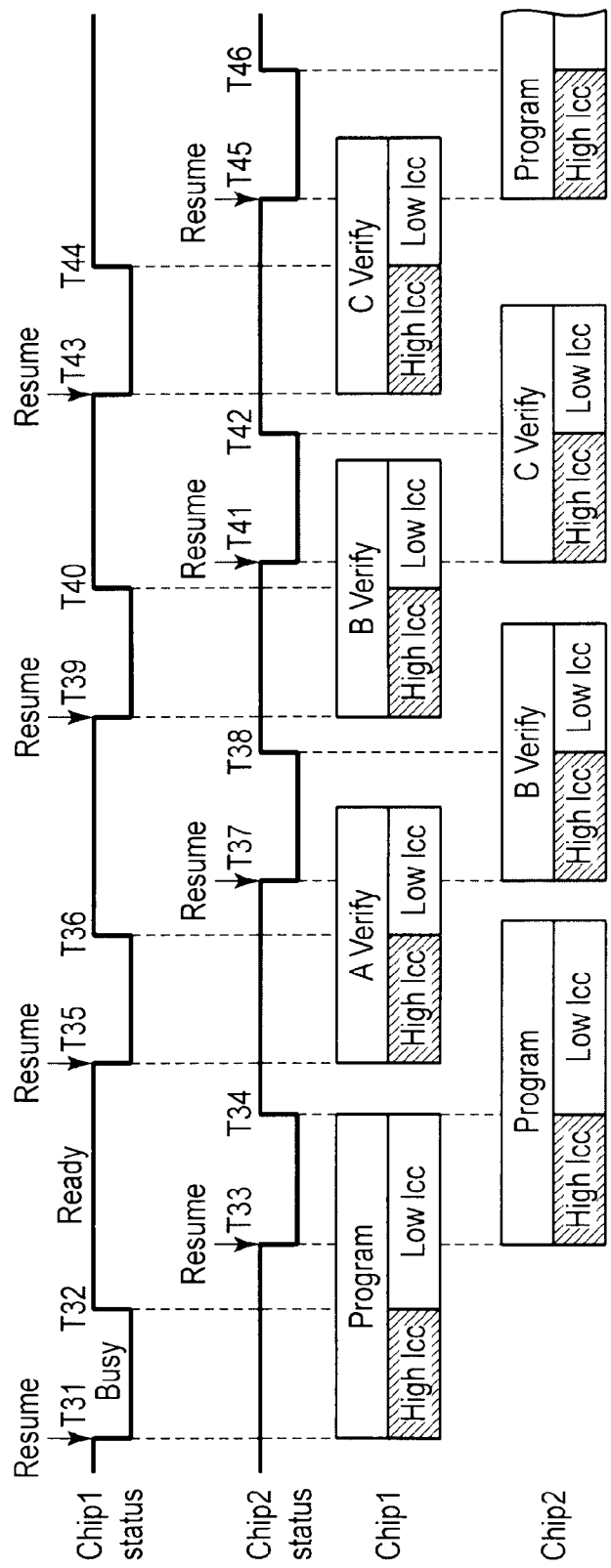
FIG. 8 is a third example showing the timing chart of the write operation in the NAND type flash memory according to the first embodiment.

FIG. 8 shows a third example of a timing chart at the time of the write operation in the NAND type flash memory chips 10-1 and 10-2 according to the first embodiment.

In this third example, operations in the program operation are separated from the A verify operation, the B verify operation, and the C verify operation in the program verify operation, and the operations of the program operation, the A verify operation, the B verify operation, and the C verify operation are started in response to input of the resume command, respectively.

In the chips 1 and 2, the high-current period in the program operation and the high-current period in the program verify operation are prevented from overlapping each other. In the program verify operation, the verify operation is performed in accordance with each threshold voltage level, and the verify operation for three levels (A<B<C) is executed in this example. It is to be noted that the high-current period of the program verify operation in the chip 1 is assumed to be present in each of the A verify operation, the B verify operation, and the C verify operation. Additionally, in the chip 2, the A verify operation has already been passed, and the high-current period of the program verify operation in the chip 2 is assumed to be present in each of the B verify operation and the C verify operation, respectively.

The operations at the time of the write operation depicted in FIG. 8 will now be described hereinafter in detail.

First, when the chip 1 is in the ready state, the controller 20 outputs the resume command ("Resume") to the chip 1 (T31). Upon receiving the resume command, the chip 1 starts the program operation ("Program"). Further, the chip 1 performs the operation in the high-current period (High Icc) during which a peak current flows. When the high-current period is finished, i.e., when the operation that consumes a high current is terminated, the chip 1 notifies the controller 20 that the chip 1 is in the ready state (T32).

After the end of the high-current period, the chip 1 carries out the operation in the low-current period (Low Icc) during which no peak current flows and terminates the program operation. After terminating the program operation, the chip 1 enters the suspend state.

When the controller 20 recognizes that the chip 1 is in the ready state, it outputs the resume command to the chip 2 (T33). When the chip 2 receives the resume command, it starts the program operation. Furthermore, the chip 2 executes the operation in the high-current period. At this time, as described above, the operation in the low-current period is performed in the chip 1 simultaneously with the operation in the high-current period of the chip 2. When the high-current period of the chip 2 is finished, the chip 2 notifies the controller 20 that the chip 2 is in the ready state (T34).

After the end of the high-current period, the chip 2 executes the operation in the low-current period and terminates the program operation. After terminating the program operation, the chip 2 enters the suspend state.

When the controller 20 recognizes that the chip 2 is in the ready state, it outputs the resume command to the chip 1 (T35). Upon receiving the resume command, the chip 1 starts the program verify operation. Moreover, the chip 1 executes the operation in the high-current period of the A verify operation ("A Verify"). When the high-current period is finished, the chip 1 notifies the controller 20 that the chip 1 is in the ready state (T36).

After the end of the high-current period, the chip 1 performs the operation in the low-current period of the A verify operation and terminates the A verify operation. After terminating the A verify operation, the chip 1 enters the suspend state.

When the controller 20 recognizes that the chip 1 is in the ready state, it outputs the resume command to the chip 2 (T37). When the chip 2 receives the resume command, it starts the program verify operation. Additionally, the chip 2 carries out the operation in the high-current period of the B verify operation ("B Verify"). At this time, as described above, the operation in the low-current period is performed in the chip 1 simultaneously with this operation in the high current period of the chip 2. When the high-current period of the chip 2 is finished, the chip 2 notifies the controller 20 that the chip 2 is in the ready state (T38).

After the end of the high-current period, the chip 2 executes the operation in the low-current period of the B verify operation and terminates the B verify operation. After terminating the B verify operation, the chip 2 enters the suspend state.

When the controller 20 recognizes that the chip 2 is in the ready state, it outputs the resume command to the chip 1 (T39). Upon receiving the resume command, the chip 1 starts the B verify operation. Furthermore, the chip 1 performs the operation in the high-current period of the B verify operation. When the high-current period is finished, the chip 1 notifies the controller 20 that the chip 1 is in the ready state (T40).

After the end of the high-current period, the chip 1 carries out the operation in the low-current period of the B verify operation and terminates the B verify operation. After terminating the B verify operation, the chip 1 enters the suspend state.

When the controller 20 recognizes that the chip 1 is in the ready state, it outputs the resume command to the chip 2 (T41). Upon receiving the resume command, the chip 2 starts the C verify operation ("C Verify"). Further, the chip 2 executes the operation in the high-current period of the C verify operation. At this time, as described above, the operation in the low-current period is executed in the chip 1 simultaneously with this operation in the high-current period of the chip 2. When the high-current period of the chip 2 is finished, the chip 2 notifies the controller 20 that the chip 2 is in the ready state (T42).

After the end of the high-current period, the chip 2 executes the operation in the low-current period of the C verify operation and terminates the C verify operation. After terminating the C verify operation, the chip 2 enters the suspend state.

When the controller 20 recognizes that the chip 2 is in the ready state, it outputs the resume command to the chip 1 (T43). Upon receiving the resume command, the chip 1 starts the C verify operation. Furthermore, the chip 1 carries out the operation in the high-current period of the C verify operation. When the high-current period is terminated, the chip 1 notifies the controller 20 that the chip 1 is in the ready state (T44).

After the end of the high-current period, the chip 1 executes the operation in the low-current period of the C verify operation and terminates the C verify operation. After terminating the C verify operation, the chip 1 enters the suspend state.

When the controller 20 recognizes that the chip 1 is in the ready state, it outputs the resume command to the chip 2 (T45). When the chip 2 receives the resume command, it starts the next program operation. Moreover, the chip 2 executes the operation in the high-current period. At this time, as described above, the operation in the low-current period is performed in the chip 1 simultaneously with the operation in the high-current period of the chip 2. When the high-current period of the chip 2 is finished, the chip 2 notifies the controller 20 that the chip 2 is in the ready state (T46).

After the end of the high-current period, the chip 2 carries out the operation in the low-current period of the program operation and terminates the program operation. After terminating the program operation, the chip 2 enters the suspend state.

The above-described operations are repeated.

Operations at the time of a read operation in the memory system according to the first embodiment will now be described hereinafter in detail.

FIG. 9 is a flowchart at the time of the read operation in the NAND type flash memory chips 10-1 and 10-2 according to the first embodiment. FIG. 10 is a timing chart at the time of the read operation in the NAND type flash memory chips 10-1 and 10-2.

In the read operation of correcting interference of a word line WLn and a word line WLn+1 that are adjacent to each other, data in the word line WLn+1 is read, then data in the word line WLn is read, and the read operation in the word line WLn is corrected in accordance with a read result of the word line WLn+1. It is to be noted that n represents a natural number equal to or above 1. In regard to the read operation, the read operation is performed in accordance with each threshold voltage level, and the read operation is assumed to be effected with respect to three levels (A<B<C) in this example.

As shown in FIG. 9, when the read operation is started (a step S21), the main control unit 12 of each of the memory chips 10-1 and 10-2 first reads out threshold voltages A, B, and C with respect to memory cells connected to the word line WLn+1 (a step S22). Subsequently, the main control unit 12 judges whether a page read out from the word line WLn+1 is a lower page or an upper page (a step S23).

When the page read out from the word line WLn+1 is the upper page, the main control unit 12 reads out the threshold voltages A and C from the memory cells connected to the word line WLn (a step S24) and terminates the read operation (a step S25). On the other hand, when the page read out from the word line WLn+1 is the lower page, the main control unit 12 reads out the threshold voltage B from the memory cells connected to the word line WLn (a step S26). Then, the read operation is terminated (the step S25).

Operations at the time of the read operation will now be described with reference to FIG. 10.

In this example, the read operation in the word line WLn+1 is separated from that in the word line WLn so that the read operations in the word line WLn+1 and the word line WLn can be started in response to input of the resume command, respectively. It is to be noted that, likewise, the high-current period during which a peak current flow is represented as "High Icc" and the low-current period during which no peak current flows is represented as "Low Icc".

In the chips 1 and 2, the high-current period of the read operation in the word line WLn+1 and the high-current period of the read operation in the word line WLn are prevented from overlapping. It is to be noted that, in the chip 1, the page read out from the word line WLn+1 is assumed to be an upper page, and the high-current period of the word line WLn at the time of the read operation is assumed to be a high-current period of the top A at the time of the read operation alone. Further, in the chip 2, the page read out from the word line WLn+1 is assumed to be a lower page and the high-current period of the word line WLn at the time of the read operation is assumed to be a high-current period of the top B at the time of the read operation alone.

First, when the chip 1 is in the ready state, the controller 20 outputs a read command ("Read Command") to the chip 1 (T51). Upon receiving the read command, the chip 1 starts the read operation in the word line WLn+1. Furthermore, the chip 1 executes an operation in the high-current period (High Icc) during which a peak current flows. When the high-current period is finished, i.e., when the operation consuming a high current is terminated, the chip 1 notifies the controller 20 that the chip 1 is in the ready state (T52).

After the end of the high-current period, the chip 1 executes an operation in the low-current period (Low Icc) during which no peak current flows and terminates the read operation in the word line WLn+1. After terminating the read operation, the chip 1 enters a suspend state.

When the controller 20 recognizes that the chip 1 is in the ready state, it outputs the read command to the chip 2 (T53). Upon receiving the read command, the chip 2 starts the read operation in the word line WLn+1. Moreover, the chip 2 carries out the operation in the high-current period. At this time, as described above, the operation in the low-current period is performed in the chip 1 simultaneously with the operation in the high-current period of the chip 2. When the high-current period of the chip 2 is terminated, the chip 2 notifies the controller 20 that the chip 2 is in the ready state (T54).

After the end of the high-current period, the chip 2 executes the operation in the low-current period and terminates the read operation in the word line WLn+1. After terminating the read operation, the chip 2 enters the suspend state.

When the controller 20 recognizes that the chip 2 is in the ready state, it outputs the resume command ("Resume") to the chip 1 (T55). Upon receiving the resume command, the chip 1 starts reading A in the word line WLn. Additionally, the chip 1 carries out the operation in the high-current period for reading A. When the high-current period is finished, the chip 1 notifies the controller 20 that the chip 1 is in the ready state (T56).

After the end of the high-current period, the chip 1 executes the operation in the low-current period. That is, the chip 1 executes the operation in the low-current period for reading A and further carries out reading C. Further, the chip 1 terminates the read operation in the word line WLn. After terminating the read operation, the chip 1 enters the suspend state.

When the controller 20 recognizes that the chip 1 is in the ready state, it outputs the resume command to the chip 2 (T57). Upon receiving the resume command, the chip 2 starts reading B in the word line WLn. Furthermore, the chip 2 performs the operation in the high-current period for reading B. At this time, the operation in the low-current period is effected in the chip 1 simultaneously with this operation in the high-current period of the chip 2. When the high-current period is finished, the chip 2 notifies the controller 2 that the chip 2 is in the ready state (T58).

After the end of the high-current period, the chip 2 carries out the operation in the low-current period. That is, the chip 2 performs the operation in the low-current period for reading B. Moreover, the chip 2 terminates the read operation in the word line WLn. After terminating the read operation, the chip 2 enters the suspend state.

The above-described operations are repeated.

As described above, in the first embodiment, each NAND type flash memory chip enters the busy state and outputs a signal indicating the Busy to the controller 20 during the operation that produces the peak current, and it enters the ready state and outputs a signal indicating the ready state to the controller 20 during the operation that generates no peak current. That is, the memory chip enters the busy state during the operation that generates the peak current, changes to the ready state when the busy state is finished, and changes to the suspend state to wait for input of the resume command before the next operation that generates the peak current.

In accordance with each memory chip, the controller 20 decides the operation that generates no peak current as the ready state, grasps the operation that produces the peak current as the busy state, prevents the busy state from overlapping among the memory chips, and issues the resume command to avoid overlap of the operation that generates the peak current among the memory chips. That is, the controller 20 can stagger the periods during which the peak current is generated among the respective memory chips by controlling a timing for issuing the resume command. As a result, it is possible to reduce a peak of consumption power generated in the memory system having the memory chips.

It is to be noted that an example of the write and read operations has been described in the first embodiment, but the embodiment can be likewise applied to other write, read, and erase operations. Furthermore, although the write and read operations in the two NAND type flash memory chips have been described, the operations can be executed by the same technique when the number of the memory chips is three or above.

Moreover, for example, when the memory chip is in the ready state in the write operation, another memory chip may be utilized to execute the read operation, or the operation that produces the peak current (e.g., error correction of ECC) may be executed on the controller side.

[2] Second Embodiment

A memory system according to a second embodiment will now be described.

In the first embodiment mentioned above, the controller configured to control the memory chips is provided, and the resume command is output to each of the memory chips from the controller, thereby preventing the operations that generate the peak current from overlapping in the respective memory chips. In this second embodiment, when memory chips enter a ready state, the memory chips start operations generating a peak current at different standby intervals, respectively. As a result, the operations generating the peak current are prevented from overlapping in the memory chips.

FIG. 11 is a block diagram showing a configuration of a memory system according to the second embodiment.

As shown in the drawing, a memory system 30 comprises semiconductor memory chips 30-$n$ ($n$ is a natural number equal to or above 1), e.g., NAND type flash memory chips (memory chips) 30-1 and 30-2.

The memory chip 30-$n$ comprises a memory cell array 31, a row decoder 32, a sense amplifier 33, an MCMBUSY control circuit 34-$n$, a chip address register 35-$n$, an internal power supply generation circuit 36, an address/data control circuit 37, a control circuit 38, and an input/output interface 39.

An output pad (or pin) is provided to each of the MCMBUSY control circuits 34-$n$ of the memory chips 30-$n$, and output pins are connected to each other between the memory chips. Further, a busy signal MCMBUSY is shared by the MCMBUSY control circuits 34-$n$ of the memory chips.

Furthermore, each of the memory chips 30-$n$ has a chip address register 35-$n$. In the chip address register, a chip address required to identify the memory chip is stored, i.e., a unique address is assigned to each memory chip. As assigning means, there are a method of storing an address in a ROM fuse which is often used in a flash memory, a method of preparing a chip address pad and changing a connection pattern for a power supply voltage Vcc or a ground voltage Vss in accordance with each memory chip at the time of bonding to this pad to define a unique chip address, and others.

The control circuit 38 controls operations of the MCM-BUSY control circuit 34-n, the internal power supply generation circuit 36, the address/data control circuit 37, and the input/output interface 39. The internal power supply generation circuit 36 generates a voltage used in the memory chip. The address/data control circuit 37 inputs/outputs signals indicative of an address, data, and others with respect to the control circuit 38, the row decoder 32, and the sense amplifier. The input/output interface 39 executes interface processing between the outside and the control circuit 38 or the address/data control circuit 37.

The row decoder 32 selects a word line in the memory cell array 31 based on a row address. The sense amplifier 33 reads out data from a memory cell connected to a selected bit line.

The memory cell array 31 includes blocks, and each block has NAND strings. Each NAND string has memory cells connected in series, and each memory cell is constituted of a nonvolatile memory cell transistor having a floating gate and a control gate arranged above the floating gate through an inter-gate insulating film.

The MCMBUSY control circuit 34-n in the memory chip 30-n will now be described.

FIG. 12 is a circuit diagram showing a configuration of the MCMBUSY control circuit in the second embodiment.

As shown in the drawing, the output pad TO is connected to the power supply voltage Vcc through a pull-up resistor R1 and a p-channel MOS transistor TR1. Moreover, the output pad TO is also connected to a reference voltage (e.g., a ground voltage) Vss through an n-channel MOS transistor TR2. Additionally, the output pad TO is connected to an input buffer, e.g., an inverter IV1.

An inverter IV2 is connected to a gate of the transistor TR2, and a chip busy signal CHIPBUSYn is input to an input terminal of the inverter IV2. An enable signal ENABLEn is input to a gate of the transistor TR1.

A busy signal MCMBUSY is output from the output pad TO, and a control signal ALLREADYn is output from an output terminal of the inverter IV1 to the control circuit 38. The busy signal MCMBUSY is shared by the memory chips 30-n, and it turns to "L" when any one of the memory chips 30-n is in a high-current period during which a peak current is generated and it changes to "H" when all the memory chips are in a low-current period during which no peak current is generated. The busy signal MCMBUSY is input as the control signal ALLREADYn (a resume trigger signal) to the control circuit 38 of each memory chip 30-n through the input buffer.

The chip busy signal CHIPBUSYn changes to "L" when the memory chip 30-n is in the high-current period during which the peak current is generated, and it turns to "H" when the memory chip 30-n is in the low-current period during which no peak current is generated. That is, the chip busy signal CHIPBUSYn changes to "L" during an operation that should be staggered in the memory chips 30-n.

Operations at the time of a write operation in the memory system according to the second embodiment will now be described. Here, although a write operation in the two NAND type flash memory chips 30-1 and 30-2 will be explained, the write operation can be executed in three or more memory chips by the same technique.

Figure 13:
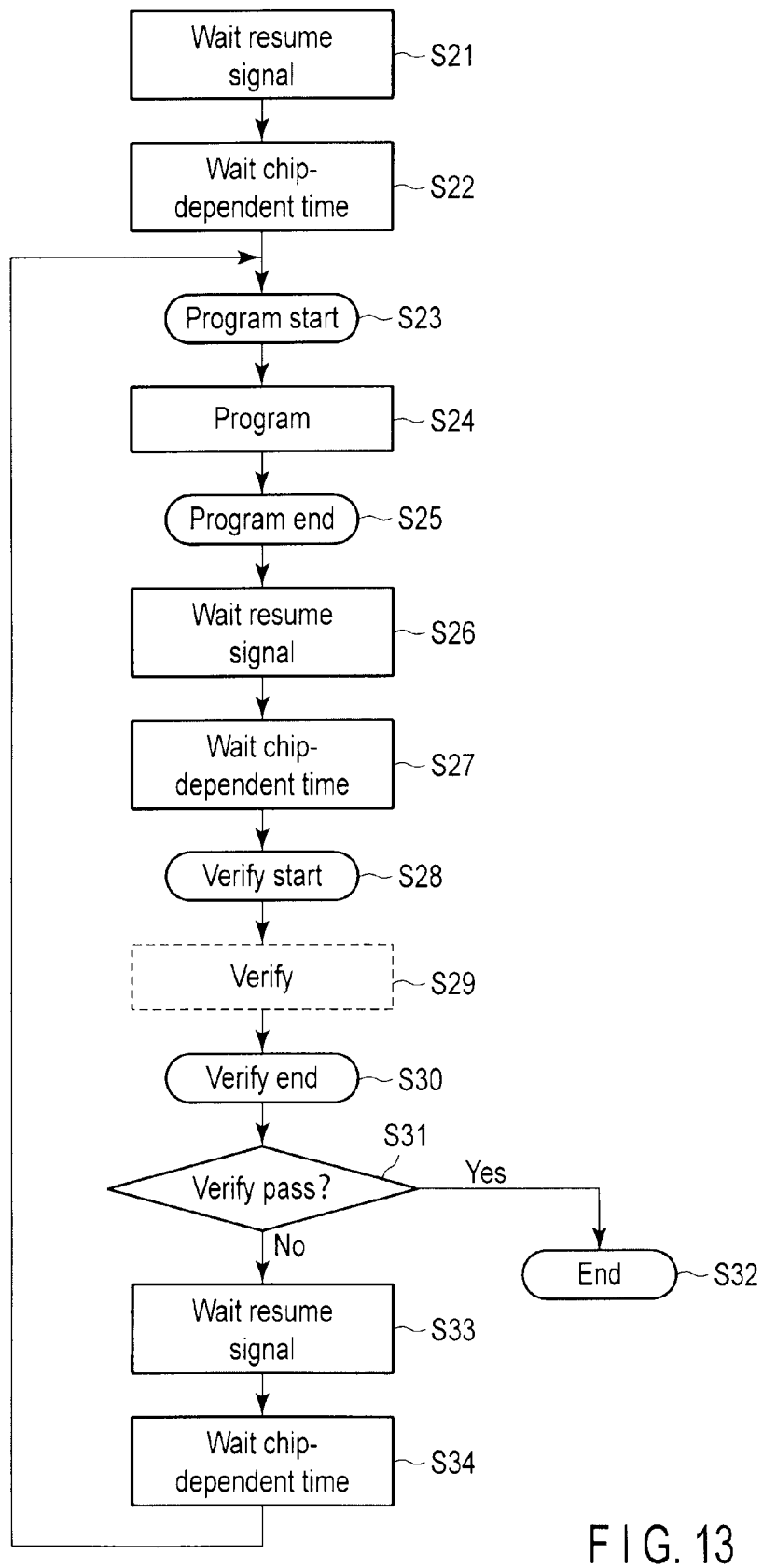
FIG. 13 is a flowchart of a write operation in the NAND type flash memory according to the second embodiment.
Figure 14:
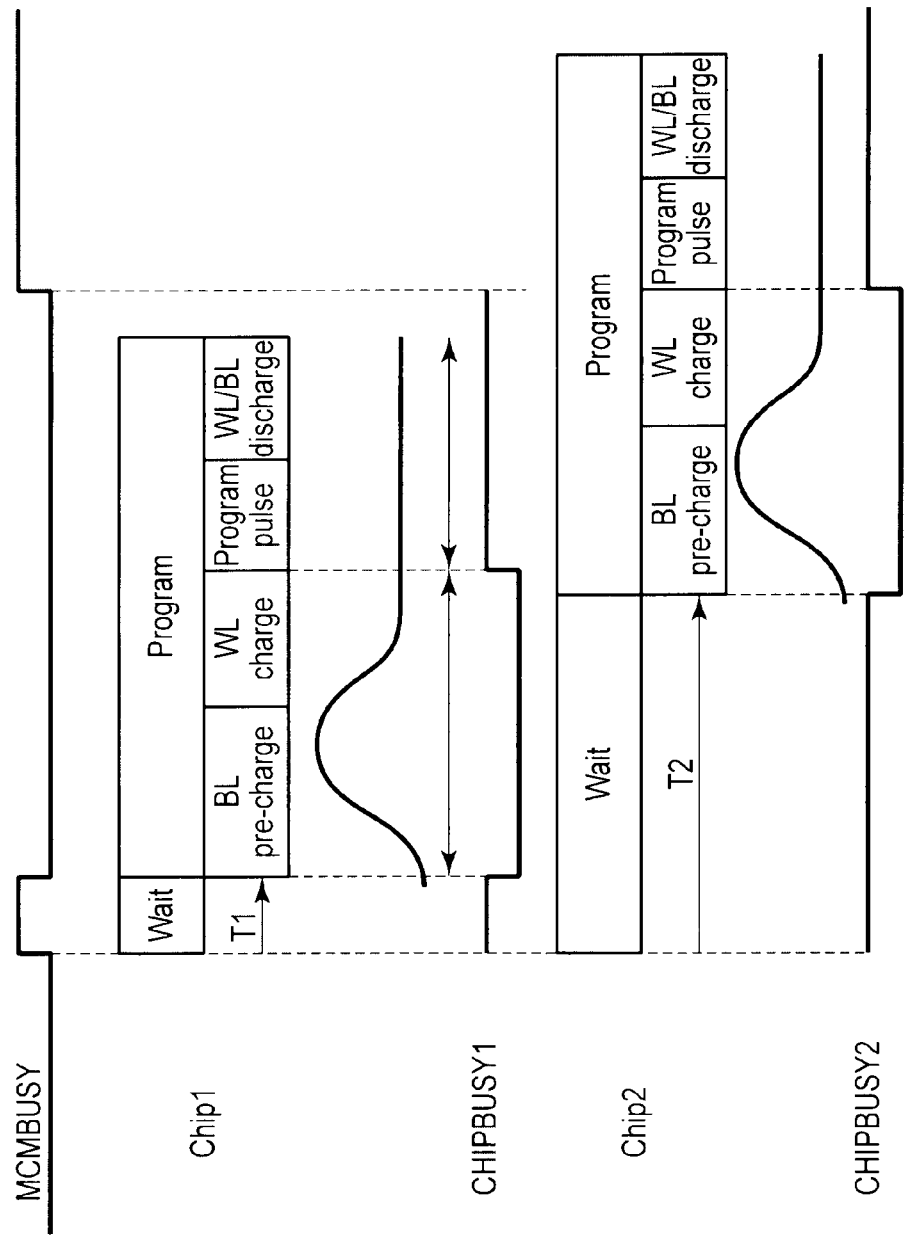
FIG. 14 is a timing chart of the write operation in the NAND type flash memory according to the second embodiment.

FIG. 13 is a flowchart at the time of the write operation in the NAND type flash memory chips 30-1 and 30-2 according to the second embodiment. FIG. 14 is a timing chart at the time of the write operation in the second embodiment.

The control circuit 38 in the memory chip 30-1 enters the low-current period (a ready state) during which all the memory chips 30-1 and 30-2 do not generate a peak current and waits until the control signal ALLREADYn is input as the resume trigger signal (("Wait Resume signal") a step S21). Upon receiving the resume trigger signal, the control circuit 38 waits until a standby time set for the memory chip 30-1 elapses (("Wait chip-dependent time") a step S22). Additionally, when the standby time elapses, the control circuit 38 starts a program operation (("Program start") a step S23) and executes the program operation (("program") a step S24). As shown in FIG. 14, the program operation is executed in the order of pre-charge of a bit line, charge of a word line, application of a program pulse, and discharge of a word line/bit line potential.

When the program operation is terminated (("Program end") a step S25), the memory chip 30-1 enters a suspend state and waits until the resume trigger signal is input (("Wait Resume signal") a step S26). Upon receiving the resume trigger signal, the control circuit 38 waits until the standby time set for the memory chip 30-1 elapses (("Wait chip-dependent time") a step S27). Further, when the standby time elapses, the control circuit 38 starts a program verify operation (("Verify Start") a step S28) and executes the program verify operation (("Verify") a step S29).

When the program verify operation is terminated (("Verify end") a step S30), the control circuit 38 judges whether the verify operation has been passed with respect to the memory cell (("Verify Pass") a step S31). When the verify operation has been passed, the write operation is terminated (("End") a step S32).

On the other hand, when the verify operation has not been passed, the control circuit 38 sets the memory chip 30-2 to the suspend state, and the memory chip 30-1 again waits until the resume trigger signal is input (("Wait Resume signal") a step S33). When the control circuit 38 receives the resume trigger signal, it waits until the standby time set for the memory chip 30-1 elapses (("Wait chip-dependent time") a step S34). Further, when the standby time elapses, the control circuit 38 returns to the step S23 to repeat the processing of the step S23 and subsequent steps.

The operations at the time of the write operation will now be described with reference to FIG. 14. It is to be noted that the NAND type flash memory chip 30-1 is a chip 1 and the NAND type flash memory chip 30-2 is a chip 2.

The busy signal MCMBUSY is shared by the chips 1 and 2, and it changes to "L" when at least one of the chips 1 and 2 is in the high-current period during which a peak current is generated or changes to "H" when both the chips 1 and 2 are in the low-current period during which no peak current is generated. The busy signal MCMBUSY is input to the control circuit 38 of each of the chips 1 and 2 through the input buffer as the control signal ALLREADYn.

The chip busy signal CHIPBUSYn changes to "L" when the chip is in the high-current period during which the peak current is generated or changes to "H" when the chip is in the low-current period during which no peak current is generated. That is, the chip busy signal CHIPBUSYn changes to "L" during an operation that should be staggered in the chips 1 and 2.

First, when the chips 1 and 2 are in the low-current period during which no peak current is generated, the signal MCMBUSY turns to "H". When the signal MCMBUSY changes to "H", the chip 1 waits for a standby time T1 set with respect to the chip 1 and starts the program operation.

In the program operation, pre-charge of a bit line, charge of a word line, application of a program pulse, and discharge of a word line/bit line potential are executed in the mentioned order. Here, when the chip busy signal CHIPBUSY1 turns to "L" and the charge of the word line is finished during the high-current period in which the pre-charge of the bit line and the charge of the word line are performed, i.e., when the high-current period is finished, the chip busy signal CHIPBUSY1 of the chip 1 turns to "H".

When the signal MCMBUSY turns to "H", the chip 2 waits for a standby time T2 set with respect to the chip 2 and starts the program operation. When the chip busy signal CHIPBUSY2 of the chip 2 changes to "L" and the charge of the word line is terminated during the high-current period in which the pre-charge of the bit line and the charge of the word line are performed, i.e., when the high-current period is finished, the chip busy signal CHIPBUSY2 turns to "H".

Here, the standby time T2 is set as a time required for the high-current period during which the peak current is generated to be finished in the chip 1. Therefore, the chip 2 starts the program operation after the elapse of the standby time T2, thereby preventing the periods that the peak current is generated from overlapping in the chips 1 and 2.

That is, the standby time from the transition to "H" of the busy signal MCMBUSY to the start of the program operation is set with respect to each memory chip, each memory chip waits for the set predetermined standby time to pass after the busy signal MCMBUSY changes to "H", and each memory chip starts the program operation after the elapse of the standby time. As a result, operations that produce the peak current can be prevented from overlapping in the memory chips.

In the second embodiment, the control circuit in each memory chip changes to the suspend state immediately before the operation that produces the peak current, like the first embodiment. Furthermore, when all the memory chips enter a period during which no peak current is generated, i.e., when the signal ALLREADYn (the resume trigger signal) changes to "L", each memory chip restarts the write operation by using this signal as a trigger. At this time, each memory chip has the standby time set with respect to each chip. This standby time is defined by a timer that differs depending on each memory chip, and the standby time differs depending on each chip address. As a result, an operation start time can be staggered by utilizing the standby time set with respect to each memory chip, whereby the period during which the peak current is generated can be staggered in the memory chips.

As described above, according to the embodiments, a peak of consumption power produced in the memory system having the nonvolatile semiconductor memories can be suppressed.

In the embodiments, although the description has been given as to the control that avoids overlap of the peak currents in regard to the write operation and the read operation, the same control can be executed in the erase operation. Moreover, the peak current can be likewise staggered in not only a case that the same type of operations, e.g., the write operation and the write operation or the read operation and the read operation are carried out in the chips but also a case in which different types of operations, e.g., the write operation in the chip 1 and the read operation in the chip 2 are performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a first nonvolatile semiconductor memory comprising a first memory cell array and a first control circuit, the first memory cell array having memory cells, the first control circuit executing a first operation that is at least one of write, read, and erase operations with respect to the first memory cell array;
a second nonvolatile semiconductor memory comprising a second memory cell array and a second control circuit, the second memory cell array having memory cells, the second control circuit executing a second operation that is at least one of write, read, and erase operations with respect to the second memory cell array; and
a detection circuit which is provided to each of the first nonvolatile semiconductor memory and the second nonvolatile semiconductor memory and detects whether both the first nonvolatile semiconductor memory and the second nonvolatile semiconductor memory are in a ready state,
wherein, when the detection circuit detects that both the first nonvolatile semiconductor memory and the second nonvolatile semiconductor memory are in the ready state,
the first control circuit starts the first operation after elapse of a first standby time, and
the second control circuit starts the second operation after elapse of a second standby time different from the first standby time, and
wherein the first operation includes a first high-current operation that consumes a current equal to or higher than a predetermined current and a first low-current operation that consumes a current smaller than that of the first high-current operation,
the second operation includes a second high-current operation that consumes a current equal to or higher than the predetermined current and a second low-current operation that consumes a current smaller than that of the second high-current operation, and
the second standby time is set to a time at which the first high-current operation included in the first operation is terminated, and the first low-current operation and the second high-current operation are concurrently executed.

2. The system according to claim 1,
wherein each of the first operation and the second operation is a write operation.

3. The system according to claim 1,
wherein each of the first operation and the second operation is a read operation.

4. The system according to claim 1,
wherein each of the first operation and the second operation is an erase operation.

5. A memory system comprising:
a first nonvolatile semiconductor memory comprising a first memory cell array and a first control circuit, the first memory cell array having memory cells, the first control circuit executing a first operation that is at least one of write, read, and erase operations with respect to the first memory cell array;

a second nonvolatile semiconductor memory comprising a second memory cell array and a second control circuit, the second memory cell array having memory cells, the second control circuit executing a second operation that is at least one of write, read, and erase operations with respect to the second memory cell array;

wherein, when the second non-volatile semiconductor memory is in a second ready state, the first control circuit outputs a first resume command to the first non-volatile semiconductor memory, and wherein, when the first non-volatile semiconductor memory receives the first resume command, the first non-volatile semiconductor memory starts a first program operation which includes a first high-current period and a first low-current period succeeding the first high-current period.

6. The system according to claim 5, wherein, when the first program operation is ended, the first non-volatile semiconductor memory starts a first verify operation.

7. The system according to claim 6, wherein, when the first high-current period is ended, the first non-volatile semiconductor memory notifies the first control circuit that the first non-volatile semiconductor memory is in a first ready state.

8. The system according to claim 7, wherein, when the first control circuit recognizes the first non-volatile semiconductor memory is in the first ready state, the second control circuit outputs a second resume command to the second non-volatile semiconductor memory.

9. The system according to claim 8, wherein, when the second non-volatile semiconductor memory receives the second resume command, the second non-volatile semiconductor memory starts a second program operation which includes a second high-current period and a second low-current period succeeding the second high-current period.

10. The system according to claim 9, wherein, when the second high-current period is ended, the second non-volatile semiconductor memory notifies the second control circuit that the second non-volatile semiconductor memory is in the second ready state, and the first non-volatile semiconductor memory starts the first verify operation.

11. The system according to claim 10, wherein, when the second program operation is ended, the second non-volatile semiconductor memory starts a second verify operation.

12. The system according to claim 11, wherein, after the second control circuit recognizes the second non-volatile semiconductor memory is in the second ready state, the first control circuit outputs the first resume command to the first non-volatile semiconductor memory, and the first non-volatile semiconductor memory starts a next first program operation after the first verify operation is ended, and when the second verify operation is ended, the second non-volatile semiconductor memory enters a suspended state.

* * * * *